(12) United States Patent
Yoshida

(10) Patent No.: US 10,165,691 B2
(45) Date of Patent: Dec. 25, 2018

(54) METHOD FOR MANUFACTURING MULTILAYER WIRING SUBSTRATE

(71) Applicant: HITACHI CHEMICAL COMPANY, LTD., Tokyo (JP)

(72) Inventor: Nobuyuki Yoshida, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 338 days.

(21) Appl. No.: 15/027,774

(22) PCT Filed: Sep. 24, 2014

(86) PCT No.: PCT/JP2014/075256
§ 371 (c)(1),
(2) Date: Apr. 7, 2016

(87) PCT Pub. No.: WO2015/053083
PCT Pub. Date: Apr. 16, 2015

(65) Prior Publication Data
US 2016/0249463 A1    Aug. 25, 2016

(30) Foreign Application Priority Data

Oct. 9, 2013  (JP) ................................ 2013-211871
Jul. 18, 2014  (JP) ................................ 2014-147756

(51) Int. Cl.
*H05K 3/42*   (2006.01)
*H05K 3/46*   (2006.01)
*H05K 3/00*   (2006.01)

(52) U.S. Cl.
CPC ......... *H05K 3/4652* (2013.01); *H05K 3/0026* (2013.01); *H05K 3/422* (2013.01);
(Continued)

(58) Field of Classification Search
CPC .................... C05K 2201/09863; C05K 3/0038
See application file for complete search history.

(56) References Cited

U.S. PATENT DOCUMENTS 6,448,506 B1   9/2002  Glenn et al.
6,564,454 B1   5/2003  Glenn et al.
(Continued)

FOREIGN PATENT DOCUMENTS

CN    1744801 A    3/2006
CN    1993024 A    7/2007
(Continued)

OTHER PUBLICATIONS

English translation of JP2009117448 (note original submitted in IDS).*

(Continued)

*Primary Examiner* — Scott W Dodds
(74) *Attorney, Agent, or Firm* — Fitch, Even, Tabin & Flannery, L.L.P.

(57) ABSTRACT

The present invention is a method for manufacturing a multilayer wiring board having (1) a step of providing with a hole for a via hole, an overhang of a metal foil formed at an opening of the hole, and lower space formed between the overhang and an inside wall of the hole, by using a conformal method or a direct laser method; and (2) a step of filling in the hole by forming electrolytic filling plating layers within the hole and on the metal foil, wherein the filling-in of the hole by the formation of electrolytic filling plating layers in the step (2) is carried out by temporarily decreasing the electric current density of electrolytic filling plating in the middle of the electrolytic filling plating, and increasing it again.

7 Claims, 6 Drawing Sheets

(52) U.S. Cl.
CPC ........... *H05K 3/423* (2013.01); *H05K 3/0035* (2013.01); *H05K 3/0038* (2013.01); *H05K 2201/0355* (2013.01); *H05K 2201/0397* (2013.01); *H05K 2201/09863* (2013.01); *H05K 2201/2072* (2013.01); *H05K 2203/1184* (2013.01); *H05K 2203/1476* (2013.01)

(56) References Cited

U.S. PATENT DOCUMENTS

| | | | |
|---|---|---|---|
| 6,708,404 | B1 | 3/2004 | Gaku et al. |
| 7,521,806 | B2 | 4/2009 | Trezza |
| 7,666,320 | B2 | 2/2010 | Kawamura et al. |
| 8,366,903 | B2 | 2/2013 | Kawamura et al. |
| 8,541,695 | B2 | 9/2013 | Ishida et al. |
| 2007/0170065 | A1* | 7/2007 | Mashino ............... C25D 5/026 205/131 |
| 2009/0301889 | A1 | 10/2009 | Reents et al. |
| 2013/0062210 | A1 | 3/2013 | Fushie et al. |
| 2013/0140074 | A1* | 6/2013 | Yang ..................... H05K 1/115 174/266 |

FOREIGN PATENT DOCUMENTS

| | | |
|---|---|---|
| CN | 101416569 A | 4/2009 |
| CN | 100589682 | 2/2010 |
| CN | 103444275 | 12/2013 |
| JP | 2003-060349 A | 8/2001 |
| JP | 2003318544 A | 11/2003 |
| JP | 2006-070318 A | 3/2006 |
| JP | 2008-021770 A | 7/2006 |
| JP | 2007180359 A | 7/2007 |
| JP | 2008182273 A | 8/2008 |
| JP | 2009021581 A | 1/2009 |
| JP | 2009117448 A | 5/2009 |
| JP | 2013-074262 A | 4/2013 |
| JP | 2013077807 A | 4/2013 |
| JP | 2013077809 A | 4/2013 |
| KR | 1020060107053 A | 10/2006 |
| WO | 2008/153185 A1 | 12/2008 |

OTHER PUBLICATIONS

International Search Report of PCT/JP2014/075257 dated Oct. 21, 2014 in English.
International Search Report of PCT/JP2014/075256 dated Oct. 28, 2014 in English.
Notice of Allowance of U.S. Appl. No. 15/027,784 dated Jan. 3, 2017.
Office Action of CN Patent Application No. 201480055474.4 dated Nov. 23, 2017.
Office Action of CN Patent Application No. 201480055472.5 dated Nov. 23, 2017.
Office Action of CN Patent Application No. 201480055473.X dated Nov. 23, 2017.

* cited by examiner

Step(2-1)

Step(2-2)

Step(2-3)

Step(2-1)

Step(2-3)

METHOD FOR MANUFACTURING MULTILAYER WIRING SUBSTRATE

CROSS-REFERENCE TO RELATED APPLICATIONS

This application is a U.S. national phase application filed under 35 U.S.C. § 371 of International Application No. PCT/JP2014/075256, filed Sep. 24, 2014, designating the United States, which claims priority from Japanese Patent Application Nos. 2013-211871 and 2014-147756, filed Oct. 9, 2013, and Jul. 18, 2014, respectively, which are hereby incorporated herein by reference in their entirety.

TECHNICAL FIELD

The present invention relates to a method for manufacturing a multilayer wiring board and particularly relates to a method for manufacturing a multilayer wiring board in which interlayer connection is formed by using an electrolytic filling plating solution.

BACKGROUND ART

Heretofore, a method for manufacturing a multilayer wiring board has been adopted, comprising integrally laminating a prepreg or a resin film on a wired inner layer material, and a metal foil as an upper layer thereof, creating a hole for a via hole by laser to form a base electroless plating layer, and then filling in the hole for a via hole with an electrolytic plating layer formed by using an electrolytic filling plating solution (hereinafter, also simply referred to as an "electrolytic filling plating layer").

In this respect, particularly, for a hole for a via hole whose via diameter is nearly equal, i.e., aspect ratio is approximately 1, or more compared with the insulating layer thickness, there is a tendency that a plating void (hereinafter, also simply referred to as a "void") easily occurs in the inside of the via. An electrolytic plating method that is carried out for a long time at a low electric current density or an electrolytic plating method with an electric current density controlled in stages has been proposed as a method for suppressing such a plating void (Patent Literature 1). Furthermore, a method of carrying out the formation of an electrolytic plating layer in two divided portions from the viewpoint of surface smoothness has been proposed as to the filling-in of the hole for a via hole (Patent Literature 2).

CITATION LIST

Patent Literature

Patent Literature 1: Japanese Unexamined Patent Publication No. 2003-318544
Patent Literature 2: Japanese Unexamined Patent Publication No. 2009-21581

SUMMARY OF INVENTION

Technical Problem

For a hole for a via hole that is formed by laser processing according to a conformal method or a direct laser method, an overhang of a metal foil appears at the opening of the hole serving as an entrance of laser processing, and due to this overhang, the opening in the cross-sectional shape of the hole may be rather narrower than the inside or the bottom. In the case of filling such a hole with electrolytic filling plating, an electrolytic filling plating layer deposited on the overhang of the metal foil at the opening blocks the opening of the hole before the electrolytic filling plating fills the inside of the hole, and is partly responsible for the occurrence of a plating void.

In recent years, a demand for miniaturization or thin models has been increasingly growing, and there is a tendency that the diameter of the hole for a via hole is smaller, the insulating layer thickness is thinner, and the aspect ratio is larger. Along with this, the overhang of the metal foil at this opening becomes relatively large with respect to the diameter or the depth of the hole and therefore has larger influence on the occurrence of a plating void. It is also considered that the void that occurs in the inside of the via hole causes problems by use for a long time or use under severe conditions.

In the method of Patent Literature 1, a method for suppressing void occurrence by controlling an electric current density is disclosed as a method for manufacturing a multilayer wiring board having a multilayer structure prepared by alternately laminating an insulating layer consisting of an organic insulating material such as polyimide resin, and a wiring pattern consisting of a conductor material such as copper. However, as a result of studies of the present inventor, the void was unable to be completely eliminated. Furthermore, in the method of Patent Literature 2, an effect of suppressing void occurrence was not obtained, though the amount of a depression generated was reduced.

An object of the present invention is to provide a method for manufacturing a multilayer wiring board capable of suppressing a plating void in an electrolytic filling plating layer even for a hole for a via hole having a diameter nearly equal to an insulating layer thickness.

Solution to Problem

The present invention relates to the following:
1. A method for manufacturing a multilayer wiring board, comprising steps of: (1) integrally laminating an inner layer material with an inner layer wiring pattern formed thereon, an insulating layer, and a metal foil for an upper layer wiring pattern, and providing the metal foil for an upper layer wiring pattern and the insulating layer with a hole for a via hole from the metal foil to the inner layer wiring pattern, an overhang of the metal foil formed at an opening of the hole, and lower space formed between the overhang and an inside wall of the hole, by using a conformal method or a direct laser method; (2) forming a base electroless plating layer within the hole and on the metal foil, then filling in the hole by forming electrolytic filling plating layers, and forming a via hole that connects the metal foil and the inner layer wiring pattern; and (3) wiring the metal foil after the formation of the electrolytic filling plating layers to form the upper layer wiring pattern, wherein the filling-in of the hole by the formation of electrolytic filling plating layers in step (2) is carried out by temporarily decreasing the electric current density of electrolytic filling plating in the middle of the electrolytic filling plating, and increasing it again, and the timing of temporarily decreasing the electric current density of electrolytic filling plating in step (2) is when the electrolytic filling plating fills the lower space between the overhang and the inside wall of the hole for a via hole, and a thickness of an electrolytic filling plating layer deposited on the bottom face of the hole is equal to or smaller than the thickness of the electrolytic filling plating layer deposited on the inside wall of the hole and on the metal foil for an upper layer wiring pattern.

2. The method for manufacturing a multilayer wiring board according to item 1, wherein the timing of temporarily decreasing the electric current density of electrolytic filling plating in step (2) is when the electrolytic filling plating fills the lower space between the overhang of the metal foil and the inside wall of the hole, and the thickness of the electrolytic filling plating layer deposited on the bottom face of the hole is equal to or smaller than the thickness of the electrolytic filling plating layer deposited on the inside wall of the hole and on the metal foil, in terms of the cross-sectional shape of the via hole, and when an aspect ratio equal to or larger than an aspect ratio which is a ratio of a depth of the hole to an opening size of the hole before the electrolytic filling plating is maintained.

3. The method for manufacturing a multilayer wiring board according to item 1 or 2, wherein the timing of temporarily decreasing the electric current density of electrolytic filling plating in step (2) is before the electrolytic filling plating fills the lower space between the overhang and the inside wall of the hole, and a plating void is formed.

4. The method for manufacturing a multilayer wiring board according to any one of items 1 to 3, wherein in step (2), the rate of decrease in electric current density in temporarily decreasing the electric current density of electrolytic filling plating in the middle of the electrolytic filling plating is 50% or more of that immediately before the decrease.

5. The method for manufacturing a multilayer wiring board according to any one of items 1 to 4, wherein in the step (2), the electric current density in temporarily decreasing the electric current density of electrolytic filling plating in the middle of the electrolytic filling plating, and then increasing it again is equal to or larger than the electric current density immediately before the temporal decrease.

Advantageous Effects of Invention

According to the present invention, a method for manufacturing a multilayer wiring board capable of suppressing a plating void in an electrolytic filling plating layer even for a hole for a via hole having a diameter nearly equal to an insulating layer thickness can be provided.

DESCRIPTION OF EMBODIMENTS

Figure 1:
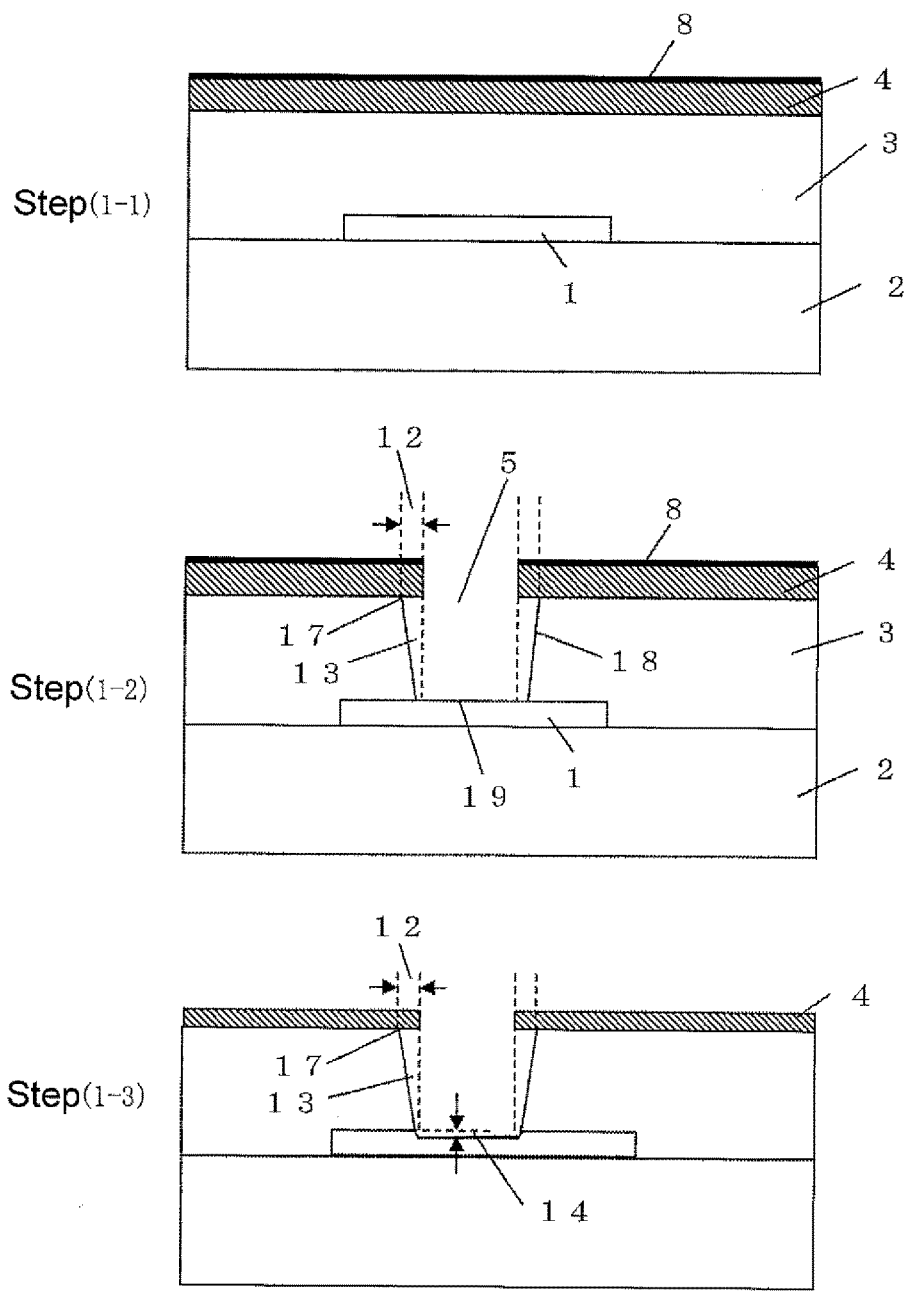
FIG. 1 shows step (1) of a method for manufacturing a multilayer wiring board of one embodiment (Examples 1 to 5) of the present invention.

The method for manufacturing a multilayer wiring board of the present invention includes a method for manufacturing a multilayer wiring board, comprising steps of: (1) integrally laminating an inner layer material with an inner layer wiring pattern formed thereon, an insulating layer, and a metal foil for an upper layer wiring pattern, and providing the metal foil and the insulating layer with a hole for a via hole from the metal foil to the inner layer wiring pattern, an overhang of the metal foil formed at au opening of this hole, and lower space formed between this overhang and an inside wall of the hole, by using a conformal method or a direct laser method; (2) forming a base electroless plating layer within the hole and on the metal foil, then filling in the hole by forming electrolytic filling plating layers, and forming a via hole that connects the metal foil and the inner layer wiring pattern; and (3) wiring the metal foil after the formation of the electrolytic filling plating layers to form the upper layer wiring pattern, wherein the filling-in of the hole by the formation of electrolytic filling plating layers in step (2) is carried out by temporarily decreasing the electric current density of electrolytic filling plating in the middle of the electrolytic filling plating, and increasing it again, and the timing of temporarily decreasing the electric current density of electrolytic filling plating in step (2) is when the electrolytic filling plating fills the lower space between the overhang and the inside wall of the hole, and a thickness of a electrolytic filling plating layer deposited on the bottom face of the hole is equal to or smaller than the thickness of the electrolytic filling plating layer deposited on the inside wall of the hole and on the metal foil.

In the method for manufacturing a multilayer wiring board of the present invention, since the hole is created in step (1) by using a conformal method or a direct laser method, an overhang of the metal foil develops at the opening of the hole, and lower space is formed between this overhang and the inside wall of the hole. An immediately lower portion, which is a region near the underside of the overhang of the metal foil becomes a region that resists the entrance of current of the electrolytic filling plating solution, in the lower space. Therefore, the lower space including this immediately lower portion is susceptible to the adsorption of the accelerator in the electrolytic filling plating solution, and at the initial stage of the electrolytic filling plating, an electrolytic filling plating layer is first formed in the lower space with this immediately lower portion as a starting point so that the lower space is filled. In this context, the lower space is space enclosed between the overhang and the inside wall of the hole, and more specifically refers to space enclosed between a perpendicular drawn from the edge of the overhang of the metal foil to the bottom of the hole and the inside wall of the hole. Once the plating accelerator is adsorbed, it has the property of remaining as it is as long as the electrolytic filling plating is continued at the same electric current density. Therefore, if the electrolytic filling plating is continued at the same electric current density as in conventional techniques, the filling plating layer that has finished the filling of the lower space keeps growing with the immediately lower portion as a starting point and blocks the opening prior to the inside of the hole. Therefore, there is a tendency that a plating void easily occurs in the inside of the hole.

The immediately lower portion refers to a region near the underside of the overhang in the lower space formed between the overhang and the inside wall of the hole. This immediately lower portion is formed by the denting of the inside wall of the insulating layer immediately below the metal foil compared with the tip of the metal foil opening, because there is a large difference in laser processability (thermal decomposition temperature) between the resin constituting the insulating layer and the immediately upper metal foil in the case of forming the hole by a conformal method or a direct laser method. Particularly, in the case of using a prepreg having reinforcing fiber as an insulating layer, a resin for bonding exists in the immediately lower portion of the metal foil, and this resin is more laser-processable than the reinforcing fiber. Thus, there is a tendency that the resin of the immediately lower portion is largely dented compared with the inside wall of the metal foil or in the inside of the hole. Therefore, the accelerator in the electrolytic filling plating solution is easily adsorbed on this immediately lower portion. Therefore, there is a tendency that the electrolytic filling plating layer grows fast (thick) and blocks the opening of the hole for a via hole.

According to the method for manufacturing a multilayer wiring board of the present invention, the accelerator adsorbed on the electrolytic filling plating layer formed at the immediately lower portion of the lower space can be separated when the electric current density of electrolytic filling plating is temporarily decreased in the middle of the electrolytic filling plating. In this respect, as long as the electrolytic filling plating layer fills the lower space, and the diameter in the inside of the hole is equal to or larger than the diameter of the opening, the plating inhibitor is easily adsorbed on the opening of the hole corresponding to the immediately lower portion whereas the plating accelerator is easily adsorbed on the inside of the hole. This effect is larger, particularly, when the electrolytic filling plating layer fills the lower space, and the filling plating layer is in a form deposited along the inside wall in the inside of the via hole. Therefore, since the growth of the electrolytic filling plating layer with the immediately lower portion as a starting point is inhibited after increasing the electric current density of electrolytic filling plating again, the electrolytic filling plating layer is preferentially formed in the inside of the hole without blocking the opening of the hole. Thus, even for a hole having a diameter nearly equal to an insulating layer thickness, it becomes possible to suppress a plating void in the electrolytic filling plating layer.

In step (2), the timing of temporarily decreasing the electric current density of electrolytic filling plating is set to when the electrolytic filling plating fills the lower space between the overhang of the metal foil and the inside wall of the hole, and a thickness of an electrolytic filling plating layer deposited on the bottom face of the hole is equal to or smaller than the thickness of the electrolytic filling plating layer deposited on the inside wall of the hole and on the metal foil, in terms of the cross-sectional shape of the via hole. As one example, it is when the filling plating layer is in a form deposited along the inside wall. As long as the electrolytic filling plating layer fills the lower space, and the thickness of the electrolytic filling plating layer deposited on the bottom face of the hole is equal to or smaller than the thickness of the electrolytic filling plating layer deposited on the inside wall of the hole and on the metal foil as mentioned above, an aspect ratio equal to or larger than an aspect ratio which is a ratio of a depth of the hole to an opening size of the hole before the electrolytic filling plating is maintained. Therefore, the plating inhibitor can be more easily adsorbed on the opening of the hole whereas the accelerator can be more easily adsorbed on the inside of the hole. Particularly, when the electrolytic filling plating layer is in a form substantially uniformly deposited along the inside wall, the cross section of the via hole becomes a shape almost straight or tapered from the opening through the bottom face, and the aspect ratio can be kept higher than that before the electrolytic filling plating. Therefore, this effect is larger.

In step (2), the timing of temporarily decreasing the electric current density of electrolytic filling plating is set to before the electrolytic filling plating fills the lower space between the overhang of the metal foil and the inside wall of the hole, and a plating void is formed. By this, the inside of the hole can be more reliably filled with the electrolytic tilling plating layers.

In step (2), it is desirable that the rate of decrease in electric current density in temporarily decreasing the electric current density of electrolytic filling plating in the middle of the electrolytic filling plating should be 50% or more of that immediately before the decrease. In this context, the rate of decrease in electric current density is percentage by which the electric current density is decreased, and means that, for example, in the case where the rate of decrease from an initial electric current density of 1 A/dm$^2$ is 50%, the electric current density after the decrease is 0.5 A/dm$^2$. Also, decreasing the electric current density includes adjusting the electric current density to 0 A/dm$^2$. By this, the plating accelerator adsorbed on the electrolytic filling plating layer formed at the immediately lower portion of the lower space can be reliably separated. Therefore, as long as the electrolytic filling plating layer fills the lower space, and the diameter in the inside of the hole for a via hole is equal to or larger than the diameter of the opening, the plating inhibitor can be more easily adsorbed on the opening of the hole whereas the accelerator can be more easily adsorbed on the inside of the hole.

In step (2), it is desirable that the electric current density, after temporarily decreasing the electric current density of electrolytic filling plating in the middle of the electrolytic filling plating and then increasing it again, should be equal to or larger than the electric current density immediately before the temporal decrease. By this, the inside of the hole can be filled with the electrolytic filling plating layers in a shorter time, and production efficiency is improved.

Furthermore, in the case of temporarily decreasing the electric current density in the middle of electrolytic filling copper plating as in the method for manufacturing a multilayer wiring board of the present invention, a streak is observed between an electrolytic filling copper plating layer of the first stage and an electrolytic filling copper plating layer of the second stage. By this streak, the boundary of the electrolytic filling copper plating layer of the first stage and the electrolytic copper plating layer of the second stage can be identified. As a result, it can be confirmed from the cross-sectional shape of the via hole whether or not the electrolytic filling copper plating layer of the first stage fills the lower space, and the diameter in the inside of the via hole is equal to or larger than the diameter of the opening. Thus, it is also easy to control the conditions of the electrolytic filling copper plating of the first stage or the thickness of the electrolytic filling copper plating layer of the first stage.

It is desirable that the hole for a via hole should be a non-through hole. In forming the non-through hole by applying the conformal method or the direct laser method, the overhang of the metal foil develops at the opening of the hole, and the lower space is easily formed between this overhang of the metal foil and the inside wall of the hole. Furthermore, in the case where the hole is a non-through hole because of having a bottom, the inside of the hole is more easily filled with the electrolytic filling plating layers by the action of the plating accelerator in the electrolytic filling plating solution, and a void in the hole can be more reliably suppressed.

The inner layer material is one that is used in a general inner layer of a multilayer wiring board and is generally prepared by integrally laminating a metal foil consisting of copper, aluminum, brass, nickel, iron, or the like alone, as an alloy, or as a composite foil on the upper surface and/or lower surface of a required number of a resin-impregnated base material having a reinforcing base material impregnated with a resin composition, and forming a wiring pattern by the etching or the like of the metal foil.

The prepreg is one that serves as an insulating layer bonding the inner layer material to a copper foil for an upper layer wiring pattern, and refers to a resin film that is in a semi-cured B-stage state by impregnating a reinforcing base material such as glass fiber with a resin composition (resin varnish) and has adhesiveness. A prepreg that is used in a general multilayer wiring board can be employed as the prepreg. Alternatively, a resin film having no reinforcing base material such as glass fiber may be used instead of the prepreg. Examples of such a resin film having no reinforcing base material such as glass fiber include polymer epoxy resins and thermoplastic polyimide adhesive films, which are used for bonding an inner layer material to a copper foil for an upper layer wiring pattern in a multilayer wiring board.

A publicly known and conventional resin composition that is used as an insulating material of a multilayer wiring board can be used as the resin composition mentioned above. Usually, a thermosetting resin having favorable heat resistance and chemical resistance is used as a base, and one type or two or more types of resins such as phenol resin, epoxy resin, polyimide resin, unsaturated polyester resin, polyphenylene oxide resin, and fluorine resin are mixed and used, and, if necessary, supplemented with an inorganic powder filler such as talc, clay, silica, alumina, calcium carbonate, aluminum hydroxide, antimony trioxide, or antimony pentoxide, or a fibrous filler such as glass fiber, asbestos fiber, pulp fiber, synthetic fiber, or ceramic fiber.

Also, a thermoplastic resin may be blended with the resin composition in consideration of dielectric characteristics, impact resistance, film processability, etc. Further, various additives such as an organic solvent, a flame retardant, a curing agent, a curing accelerator, a thermoplastic particle, a colorant, a UV-opaque agent, an antioxidant, and a reducing agent, or fillers are added and prepared, if necessary.

A woven fabric, nonwoven fabric, paper, a mat, or the like of inorganic fiber such as glass or asbestos, organic fiber such as polyester, polyamide, polyacryl, polyvinyl alcohol, polyimide, or fluorine resin, or natural fiber such as cotton is used as the reinforcing base material mentioned above.

Usually, the reinforcing base material is impregnated or coated such that the amount of the resin composition attached to the reinforcing base material becomes 20 to 90% by mass in terms of a resin content of the prepreg after drying, and then dried by heating usually at a temperature of 100 to 200° C. for 1 to 30 minutes to obtain a prepreg in a semi-cured state (B-stage state). Heating and pressurization are performed in a constitution in which 1 to 20 such prepregs are usually layered and metal foils are disposed on both surfaces thereof. An approach for usual laminated plates can be applied as molding conditions. Usually, molding is performed at a temperature of 100 to 250° C. and a pressure of 2 to 100 kg/cm2 for a heating time in the range of 0.1 to 5 hours by using, for example, a multiplaten press, a multi platen vacuum press, continuous molding, or an autoclave molding machine, or carried out under lamination conditions of 50 to 150° C. and 0.1 to 5 MPa and under reduced pressure or atmospheric conditions by using a vacuum lamination apparatus or the like. Although the thickness of the prepreg serving as an insulating layer differs depending on use, one having a thickness of 0.1 to 5.0 mm is usually preferred.

The metal foil can employ a foil of a metal that is used in a general multilayer wiring board. It is preferred in terms of electric characteristics that the surface roughness of the metal foil used in the present invention should be 2.0 µm or less for both surfaces in terms of ten point mean roughness (Rz) shown in JIS B0601. A copper foil, a nickel foil, an aluminum foil, or the like can be used as the metal foil, and a copper foil is usually employed. Conditions involving 50 to 100 g/L of sulfuric acid, 30 to 100 g/L of copper, a solution temperature of 20° C. to 80° C. and an electric current density of 0.5 to 100 A/dm$^2$ in the case of a copper sulfate bath, or conditions involving 100 to 700 g/L of potassium pyrophosphate, 10 to 50 g/L of copper, a solution temperature of 30° C. to 60° C., pH of 8 to 12, and an electric current density of 1 to 10 A/dm$^2$ in the case of a copper pyrophosphate bath are generally often used as manufacturing conditions for the copper foil, and various additives may be added in consideration of the physical properties or smoothness of copper.

Anti-rust treatment that is carried out for the resin bonding face of the metal foil can be carried out by using any of nickel, tin, zinc, chromium, molybdenum, and cobalt, or an alloy thereof. These perform thin film formation on the metal foil by sputtering, electroplating, or electroless plating, and electroplating is preferred in terms of cost. Although the amount of the anti-rust treatment metal differs depending on the type of the metal, 10 to 2000 µg/dm$^2$ in total is preferred. If the anti-rust treatment is too thick, etching inhibition and reduction in electric characteristics are caused. If it is too thin, it may become a factor for reduction in peel strength against resin. Further, if a chromate-treated layer is formed on the anti-rust treatment, it can suppress reduction in peel strength against resin and is therefore useful.

The via hole is a non-through interlayer connection hole in which plating layers for connecting two or more layers of wiring layers are formed, and an interstitial via hole (IVH) is included. The hole for a via hole is a non-through hole for forming the via hole and refers to a state before a plating layer is formed. Also, one in which a plating layer is formed on the intra-hole surface of the hole for a via hole as well as a filled via in which the inside of the hole is completely filled in with plating layers is also included. One in which the diameter of the via hole is from nearly equal to the thickness of the insulating layer to about twice this thickness is likely to form the filled via. However, if the diameter approaches a value nearly equal to the thickness of the insulating layer, a void more easily occurs in conventional methods.

An electroless plating layer serving as a base for the electrolytic filling plating layers is an electroless plating layer disposed throughout the surface of a substrate after creating the hole for a via hole, and the surface of the metal foil for an upper layer wiring pattern, the intra-hole lateral face of the hole for a via hole, the inner layer wiring pattern surface on the bottom face within the hole for a via hole, etc., is plated. This electroless plating layer can be formed by using an electroless copper plating solution of thin coating type that is generally used in the manufacture of a multilayer wiring board.

The electrolytic filling plating layer refers to an electrolytic plating layer formed by an electrolytic filling plating solution. As for the thickness of this electrolytic filling plating layer, the thickness on the bottom face within the hole for a via hole is larger than the thickness on the metal foil for an upper layer wiring pattern. The thickness of the electrolytic filling plating layer of the first stage is preferably 1 to 10 μm, more preferably in the range of 2 to 5 μm, as a thickness on the metal foil, and is provided so as to be in the range of approximately 2 to 20 μm as a thickness on the inner layer wiring pattern on the bottom face within the hole. Also, as for the thickness of the electrolytic filling plating layer of the second stage, the thickness on the metal foil is not limited as long as it can be employed as a wiring pattern and the hole can be completely filled in with the electrolytic filling plating layers. For the thickness on the metal foil, it is preferred to be in the range of 1 to 100 μm, and it is more preferred to be in the range of 10 to 50 μm.

The electrolytic filling plating solution is generally one in which a plating inhibitor that inhibits plating growth and a plating accelerator that accelerators plating growth have been added into a copper sulfate plating bath.

The plating inhibitor is difficult to adsorb on the inside of the hole for a via hole and easy to adsorb on substrate surface according to the diffusion rule of materials. By applying this, it is reportedly effective to fill the inside of the hole with an electrolytic filling copper plating layer and form a smooth electrolytic filling copper plating layer on substrate surface at an immediately upper portion of the hole and a portion other than the immediately upper portion of the hole, by slowing down the plating growth rate of the substrate surface compared with the inside of the hole. A polyether compound such as polyalkylene glycol, a nitrogen-containing compound such as a quaternary polyvinyl imidazolium compound or a copolymer of vinyl pyrrolidone and a quaternary vinyl imidazolium compound, or the like can be used as the plating inhibitor.

The plating accelerator is uniformly adsorbed on the bottom face and the lateral face within the hole for a via hole, and substrate surface, and subsequently, the surface area is decreased in the inside of the hole with plating growth so that the distribution of the accelerator within the hole becomes dense. By utilizing this, it is reportedly effective to fill the inside of the hole with an electrolytic filling copper plating layer and form a smooth electrolytic filling copper plating layer on substrate surface at an immediately upper portion of the hole and a portion other than the immediately upper portion of the hole, as a result of accelerating the plating rate in the inside of the hole compared with the plating rate of the substrate surface. A sulfur compound represented by sodium 3-mercapto-1-propanesulfonate or sodium 2-mercaptoethanesulfonate, or a sulfur compound represented by disodium bis-(3-sulfopropyl)-disulfide or the like can be used as the plating accelerator. These plating accelerators are also one type of additive that is called a brightener and added to a copper plating solution.

One or two or more of these plating inhibitors or plating accelerators are mixed and used. Their concentrations in aqueous solutions are not particularly limited, but can be used at a concentration of several ppm by mass to several % by mass.

EXAMPLES

Hereinafter, the present invention will be described with reference to Examples, and however, the present invention is not intended to be limited by the present Examples.

Example 1

First, as shown in step (1-1) of FIG. 1, a single-sided copper foil-clad resin film was vacuum-laminated on an inner layer material 2 with an inner layer wiring pattern 1 formed thereon under conditions of 120° C. and 2 MPa. The thickness of a resin film serving as an insulating layer 3 was 30 μm, and the thickness of a copper foil 4 for an upper layer wiring pattern 10 was 5 μm. Next, a blackened layer 8 having a thickness of 0.3 to 0.5 μm was formed on the surface of this copper foil 4. Then, as shown in step (1-2) of FIG. 1, a hole 5 for a via hole having a diameter of 30 μm was processed by the direct laser method with $CO_2$ laser. Specifically, this hole 5 had a depth of 35 μm in which the thickness (30 μm) of the resin film and the thickness (5 μm) of the copper foil 4 were summed, and the diameter of an opening of the copper foil 4 was 35 μm. Therefore, the aspect ratio was approximately 1.0. An overhang 12 of the copper foil 4 developed at an opening of the hole 5, and lower space 13 was formed between this overhang 12 and an inside wall 18 of the hole 5. The amount of the overhang of the copper foil 4 was approximately 8 μm on one side of the hole 5. Also, an immediately lower portion 17 was formed in a region near the underside of the overhang 12 in the lower space 13.

Next, as shown in step (1-3) of FIG. 1, half etching was performed with an etching solution such as an aqueous ferric chloride solution, ammonium persulfate, or a sulfuric acid-hydrogen peroxide water mixed aqueous solution until the thickness of the copper foil 4 became 2 to 3 μm in order to remove the blackened layer 8 on the copper foil 4.

Next, resins attached to the bottom of a via hole were removed by carrying out desmear treatment. Then, as shown in step (2-1) of FIG. 2, catalytic nuclei were imparted onto the copper foil 4 and to the inside of the hole 5 by using HS201B (trade name, manufactured by Hitachi Chemical Co., Ltd.), which is a palladium colloid catalyst, and then, an electroless copper plating layer 6 having a thickness of 0.5 μm and serving as a base for electrolytic filling copper plating was formed by using CUST2000 (trade name, manufactured by Hitachi Chemical Co., Ltd.: "CUST" is a registered trademark).

Figure 2:
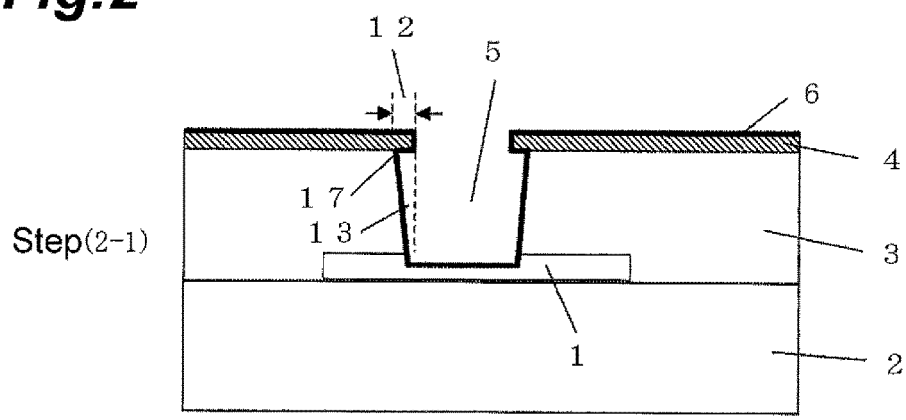
FIG. 2 shows step (2) of a method for manufacturing a multilayer wiring board of one embodiment (Examples 1 to 5) of the present invention.
Figure 2:
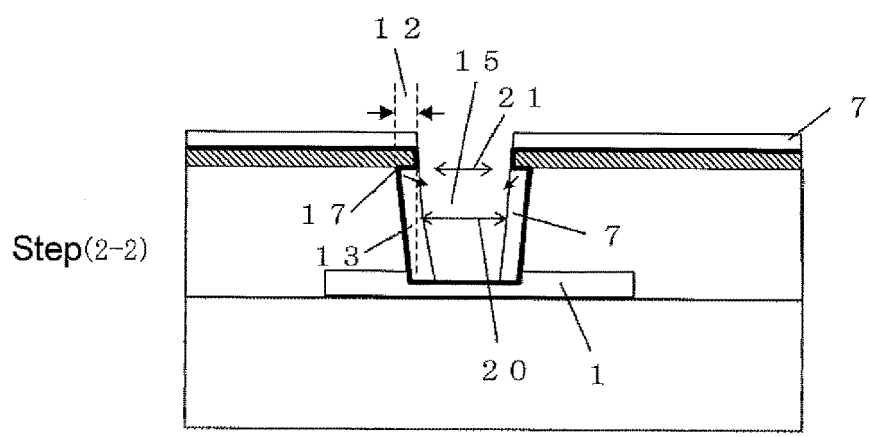
Figure 2:
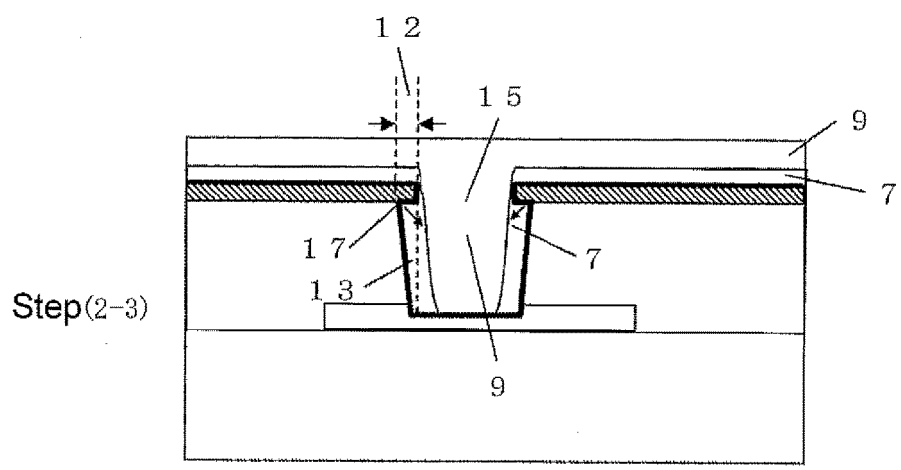

Next, as shown in step (2-2) of FIG. 2, an electrolytic filling copper plating layer 7 was formed in a first stage to a thickness of 2 μm on the copper foil 4 and to a thickness of 2 to 15 μm on the bottom face 19 within the hole 5. A commercially available direct current electrolytic plating solution CU-BRITE VFIV (trade name, manufactured by JCU Corp.) was used as an electrolytic filling copper plating solution. In this respect, conditions for the electrolytic tilling copper plating of the first stage are approximately 8 minutes at an electric current density of 1.0 $A/dm^2$. In this case, for the cross-sectional shape of the via hole 15 in which the electrolytic filling copper plating layer 7 of the first stage was formed, the electrolytic filling plating layer 7 of the first stage filled the lower space. 13, and the thickness of the electrolytic filling plating layer 7 deposited on the bottom face 19 of the hole 5 was equal to or smaller than the thickness of the electrolytic filling plating layer 7 deposited on the inside wall 18 of the hole 5 and on the metal foil 4. Furthermore, the electrolytic filling plating layer 7 was in a form substantially uniformly deposited along the inside wall 18, and the cross section of the via hole 15 had a shape tapered from the opening through the bottom face 19.

Next, in order to temporarily decrease the electric current density of electrolytic filling copper plating, the power of the rectifier was temporarily turned off, and it was kept at 0 $A/dm^2$ for 1 minute. Continuously therewith, as shown in step (2-3) of FIG. 2, a second stage of filling of the via hole 15 was then carried out with an electrolytic filling copper plating layer 9 to a thickness of 18 μm on the copper foil 4 and the electrolytic filling copper plating layer 7. In this respect, conditions for the electrolytic filling copper plating of the second stage were approximately 80 minutes at an electric current density of 1.0 A/dm². During this, the substrate remained dipped in the electrolytic filling copper plating solution.

Figure 3:
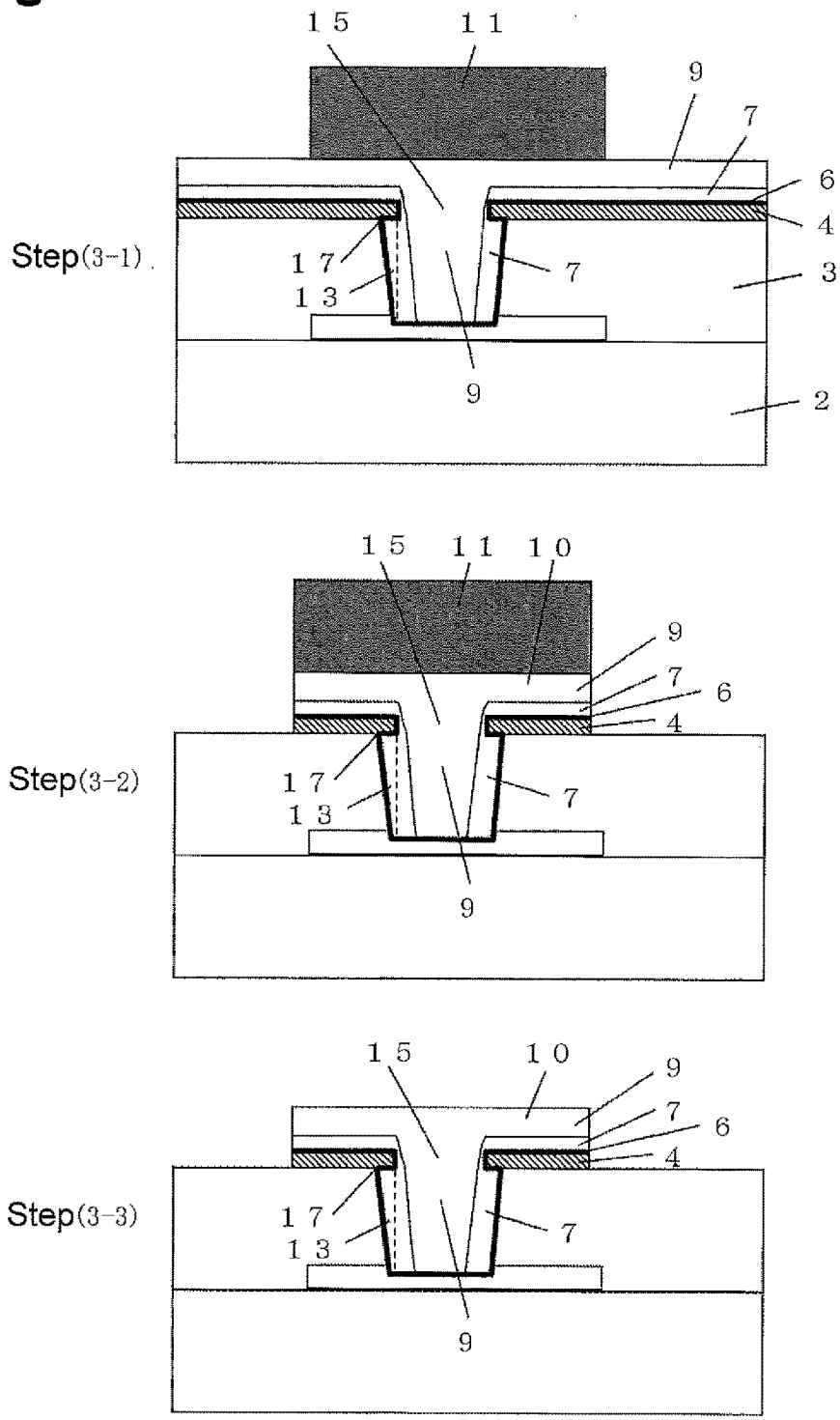
FIG. 3 shows step (3) of the method for manufacturing a multilayer wiring board of one embodiment (Examples 1 to 5) of the present invention.

Next, as shown in step (3-1) of FIG. 3, an etching resist 11 having a thickness of 29 μm is formed by using SL-1229 (trade name, Hitachi Chemical Co., Ltd.), which is a dry film resist. The etching resist 11 is removed, except for a site on the hole 5 and a site that should become the upper layer wiring pattern 10. Next, as shown in step (3-2) of FIG. 3, copper other than the upper layer wiring pattern 10 was removed by etching, and then, the stripping of the etching resist 11 was carried out by using an alkaline stripping solution, sulfuric acid, or a commercially available resist stripping solution to form the upper layer wiring pattern 10.

Example 2

Step (1-1) of FIG. 1 to step (2-1) of FIG. 2 were taken in the same way as in Example 1. Next, as shown in step (2-2) of FIG. 2, an electrolytic filling copper plating layer 7 was formed in a first stage to a thickness of 2 μm on the copper foil 4 and to a thickness of 2 to 15 μm on the bottom face 19 within the hole 5. The same electrolytic filling copper plating solution as in Example 1 was used. In this respect, conditions for the electrolytic filling copper plating of the first stage were approximately 8 minutes at an electric current density of 1.0 A/dm².

Next, the electric current density of electrolytic filling copper plating was dropped from 1.0 A/dm² to 0.3 A/dm², which was kept for 1 minute, while the electrolytic tilling copper plating was continued. Continuously therewith, as shown in step (2-3) of FIG. 2, a second stage filling of the via hole 15 was then carried out with an electrolytic filling copper plating layer 9 to a thickness of 18 μm on the copper foil 4 and the electrolytic filling copper plating layer 7. In this respect, conditions for the electrolytic filling copper plating of the second stage were approximately 80 minutes at an electric current density of 1.0 A/dm². During this, the substrate remained dipped in the electrolytic filling copper plating solution. Next, steps (3-1) to (3-3) of FIG. 3 were taken in the same way as in Example 1.

Example 3

Step (1-1) of FIG. 1 to step (2-1) of FIG. 2 were taken in the same way as in Example 1. Next, as shown in step (2-2) of FIG. 2, an electrolytic filling copper plating layer 7 was formed in a first stage to a thickness of 2 μm on the copper foil 4 and to a thickness of 2 to 15 pin on the bottom face 19 within the hole 5. The same electrolytic plating solution as in Example 1 was used. In this respect, conditions for the electrolytic filling copper plating of the first stage were approximately 8 minutes at an electric current density of 1.0 A/dm².

Next, the electric current density of electrolytic filling copper plating was dropped from 1.0 A/dm² to 0.5 A/dm², which was kept for 1 minute, while the electrolytic tilling copper plating was continued. Continuously therewith, as shown in step (2-3) of FIG. 2, a second stage of filling of the via hole 15 was then carried out with an electrolytic filling copper plating layer 9 to a thickness of 18 μm on the copper foil 4 and the electrolytic filling copper plating layer 7. In this respect, conditions for the electrolytic filling copper plating of the second stage were approximately 80 minutes at an electric current density of 1.0 A/dm². During this, the substrate remained dipped in the electrolytic filling copper plating solution. Next, steps (3-1) to (3-3) of FIG. 3 were taken in the same way as in Example 1.

Example 4

Step (1-1) of FIG. 1 to step (2-1) of FIG. 2 were taken in the same way as in Example 1. Next, as shown in step (2-2) of FIG. 2, an electrolytic filling copper plating layer 7 was formed in a first stage to a thickness of 2 μm on the copper foil 4 and to a thickness of 2 to 15 μm on the bottom face 19 within the hole 5. The same electrolytic plating solution as in Example 1 was used In this respect, conditions for the electrolytic filling copper plating of the first stage were approximately 8 minutes at an electric current density of 1.0 A/dm².

Next, the electric current density of electrolytic filling copper plating was dropped from 1.0 A/dm² to 0.5 A/dm², which was kept for 1 minute, while the electrolytic filling copper plating was continued. Continuously therewith, as shown in step (2-3) of FIG. 2, a second stage of filling of the via hole 15 was then carried out with an electrolytic filling copper plating layer 9 to a thickness of 18 μm on the copper foil 4 and the electrolytic filling copper plating layer 7. In this respect, conditions for the electrolytic filling copper plating of the second stage were approximately 56 minutes at an electric current density of 1.5 A/dm². During this, the substrate remained dipped in the electrolytic filling copper plating solution. Next, steps (3-1) to (3-3) of FIG. 3 were taken in the same way as in Example 1.

Example 5

Step (1-1) of FIG. 1 to step (2-1) of FIG. 2 were taken in the same way as in Example 1. Next, as shown in step (2-2) of FIG. 2, an electrolytic filling copper plating layer 7 was formed in a first stage to a thickness of 1 μm as on the copper foil 4 and to a thickness of 1 to 7 μm a thickness on the bottom face 19 within the hole 5. The same electrolytic tilling plating solution as in Example 1 was used. In this respect, conditions for the electrolytic filling copper plating of the first stage were approximately 4 minutes at an electric current density of 1.0 A/dm².

Next, the electric current density of electrolytic filling copper plating was dropped from 1.0 A/dm² to 0.5 A/dm², which was kept for 1 minute, while the electrolytic filling copper plating was continued. Continuously therewith, as shown in step (2-3) of FIG. 2, a second stage of filling of the via hole 15 was then carried out with an electrolytic filling copper plating layer 9 to a thickness of 19 μm on the copper foil 4 and the electrolytic filling copper plating layer 7. In this respect, conditions for the electrolytic filling copper plating of the second stage were approximately 84 minutes at an electric current density of 1.0 A/dm². During this, the substrate remained dipped in the electrolytic filling copper plating solution. Next, steps (3-1) to (3-3) of FIG. 3 were taken in the same way as in Example 1.

Comparative Example 1

Figure 5:
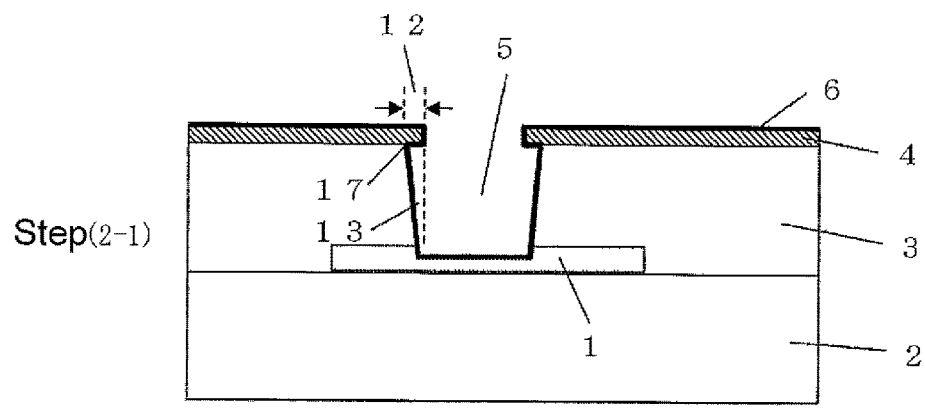
FIG. 5 shows step (2) of a method for manufacturing a multilayer wiring board of Comparative Example 1.
Figure 5:
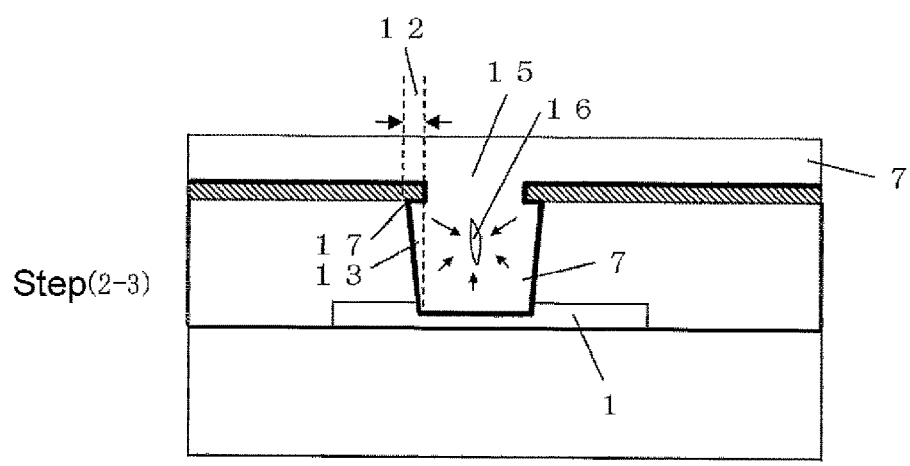
Figure 6:
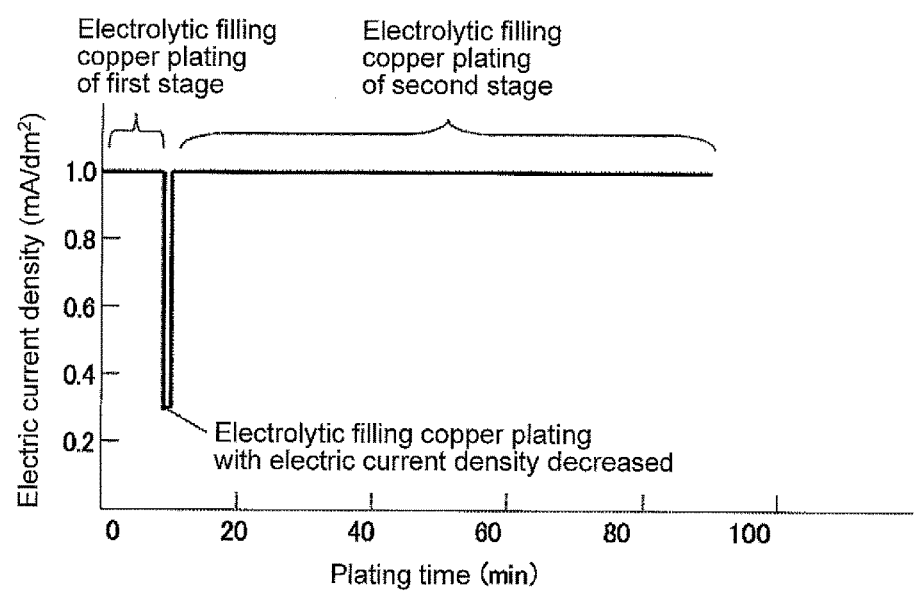
FIG. 6 shows the electric current density of electrolytic filling plating in a method for manufacturing a multilayer wiring board of one embodiment (Example 2) of the present invention.

Step (1-1) of FIG. 1 to step (2-1) of FIG. 2 were taken in the same way as in Example 1. Next, as shown in step (2-3) of FIG. 5, an electrolytic filling copper plating layer 7 was formed in a first stage (as one stage) to a thickness of 20 μm on the copper foil 4. The same electrolytic filling copper plating solution as in Example 1 was used. In this respect, conditions for the electrolytic filling copper plating of the first stage were approximately 88 minutes at an electric current density of 1.0 A/dm². Next, steps (3-1) to (3-3) of FIG. 3 were taken in the same way as in Example 1.

Comparative Example 2

Figure 4:
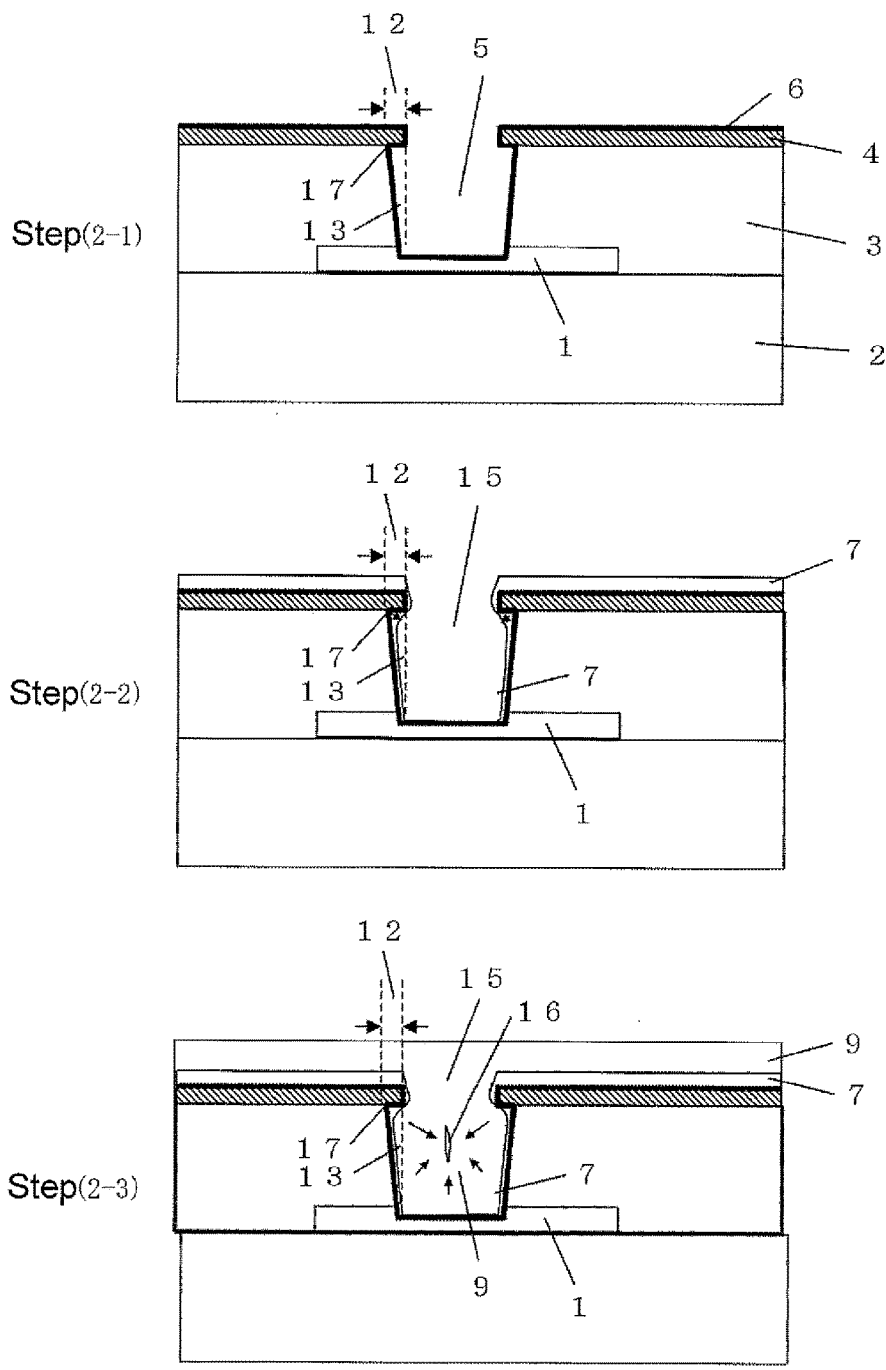
FIG. 4 shows step (2) of a method for manufacturing a multilayer wiring board of Comparative Example 2.

Step (1-1) of FIG. 1 to step (2-1) of FIG. 2 were taken in the same way as in Example 1. Next, as shown in step (2-2) of FIG. 4, an electrolytic filling copper plating layer 7 was formed in a first stage to a thickness of 0.5 μm on the copper foil 4 and to a thickness of 0.5 to 3 μm on the bottom face 19 within the hole 5. The same electrolytic filling copper plating solution as in Example 1 was used. In this respect, conditions for the electrolytic filling copper plating of the first stage were approximately 2 minutes at an electric current density of 1.0 A/dm². In this case, the electrolytic filling plating layer 7 of the first stage did not fill the lower space 13, in terms of the cross-sectional shape of the via hole 15 in which the electrolytic filling copper plating layer 7 of the first stage was formed.

Next, the electric current density of electrolytic filling copper plating was dropped from 1.0 A/dm² to 0.5 A/dm², which was kept for 1 minute, while the electrolytic tilling copper plating was continued. Continuously therewith, as shown in step (2-3) of FIG. 4, a second stage of filling of the via hole 15 was then carried out with an electrolytic filling copper plating layer 9 to a thickness of 19.5 μm on the copper foil 4 and the electrolytic filling copper plating layer 7. In this respect, conditions for the electrolytic filling copper plating of the second stage were approximately 86 minutes at an electric current density of 1.0 A/dm². During this, the substrate remained dipped in the electrolytic filling copper plating solution. Next, steps (3-1) to (3-3) of FIG. 3 were taken in the same way as in Example 1.

The occurrence frequency of a plating void was summarized in Table 1 by observing the cross section of the via hole under a microscope in Examples 1 to 5 and Comparative Examples 1 and 2. In Examples 1 to 4, the occurrence frequency of a void was 0%, and the hole for a via hole was able to be filled. In Example 5, the rate of occurrence of a void was 6.5%, and the hole for a via hole was able to be almost filled. On the other hand, in Comparative Example 1, the occurrence of a void was almost 100%. In Comparative Example 2, the rate of occurrence of a void was 75%. Furthermore, in Examples 1 to 5 and Comparative Examples 2 in which the electric current density was temporarily decreased in the middle of electrolytic filling copper plating, a streak was observed between the electrolytic filling copper plating layer of the first stage and the electrolytic filling copper plating layer of the second stage. By this streak, the boundary of the electrolytic filling copper plating layer of the first stage and the electrolytic copper plating layer of the second stage was able to be identified. As a result, in the cross-sectional shape of the via hole in Examples 1 to 5, it was able to be confirmed that the electrolytic filling copper plating layer of the first stage filled the lower space, and the thickness of the electrolytic filling plating layer deposited on the bottom face of the hole for a via hole was equal to or smaller than the thickness of the electrolytic filling plating layer deposited on the inside wall of the hole for a via hole and on the metal foil for an upper layer wiring pattern. On the other hand, in the cross-sectional shape of the via hole of Comparative Example 1, the streak indicating the boundary of the electrolytic filling copper plating layer of the first stage and the electrolytic copper plating layer of the second stage was not observed, demonstrating that the electrolytic filling copper plating layer in the lower space starting at the immediately lower portion grew thicker than the other sites in the inside of the via hole and blocked the opening with a void remaining. Also, in the cross-sectional shape of the via hole of Comparative Example 2, the electrolytic filling copper plating layer of the first stage did not fill the lower space. Therefore, as with Comparative Example 1, it was demonstrated that the electrolytic filling copper plating layer of the second stage grew thick in the lower space starting at the immediately lower portion and blocked the opening with a void remaining.

TABLE 1

| Item | Example 1 | Example 2 | Example 3 | Example 4 | Example 5 | Comparative Example 1 | Comparative Example 2 |
|---|---|---|---|---|---|---|---|
| Electrolytic filling plating of first stage | 1.0 A/dm² × 8 min | 1.0 A/dm² × 8 min | 1.0 A/dm² × 8 min | 1.0 A/dm² × 8 min | 1.0 A/dm² × 4 min | 1.0 A/dm² × 88 min | 1.0 A/dm² × 2 min |
| Electrolytic filling plating with electric current decreased | 0 A/dm² × 1 min | 0.3 A/dm² × 1 min | 0.5 A/dm² × 1 min | 0.5 A/dm² × 1 min | 0.8 A/dm² × 1 min | — | 0.8 A/dm² × 1 min |
| Electrolytic filling plating of second stage | 1.0 A/dm² × 80 min | 1.0 A/dm² × 80 min | 1.0 A/dm² × 80 min | 1.5 A/dm² × 56 min | 1.0 A/dm² × 84 min | — | 1.0 A/dm² × 86 min |
| Rate of occurrence of void | 0% | 0% | 0% | 0% | 6.5% | 100% | 75% |

REFERENCE SIGNS LIST

1. Inner layer wiring pattern
2. Inner layer material
3. Prepreg or insulating layer
4. Metal foil or copper foil
5. Hole for via hole
6. Electroless plating layer or electroless copper plating layer
7. Electrolytic filling plating layer of the first stage or electrolytic filling copper plating layer of the first stage
8. Blackened layer
9. Electrolytic filling plating layer of the second stage or electrolytic filling copper plating layer of the second stage
10. Upper layer wiring pattern
11. Etching resist
12. Overhang of the metal foil
13. Lower space
14. Depression
15. Via hole or interlayer connection
16. Void
17. Immediately lower portion 18. Inside wall
19. Bottom or bottom face
20. Diameter (in the inside)
21. Diameter (of the opening)

The invention claimed is:

1. A method for manufacturing a multilayer wiring board, comprising:
   (1) a step of integrally laminating an inner layer material with an inner layer wiring pattern formed thereon, an insulating layer, and a metal foil for an upper layer wiring pattern, and forming a hole for a via hole in the metal foil and the insulating layer, the hole being formed from the metal foil to the inner layer wiring pattern, an overhang of the metal foil being formed at an opening of the hole and a lower space being formed between the overhang and an inside wall of the hole;
   (2) a step of forming a base electroless plating layer within the hole and on the metal foil, then filling in the hole by forming electrolytic filling plating material, and thus forming a via hole that connects the metal foil and the inner layer wiring pattern; and
   (3) a step of forming an upper layer wiring pattern on the insulating layer after the formation of the electrolytic filling plating material,
   wherein the filling-in of the hole by the formation of the electrolytic filling plating material in step (2) is carried out by temporarily decreasing an electric current density and then increasing the electric current density while performing electrolytic filling plating, and
   wherein temporarily decreasing the electric current density occurs when the electrolytic filling plating material fills the lower space between the overhang of the metal foil and the inside wall of the hole, and a thickness of an electrolytic filling plating material deposited on a bottom face of the hole is equal to or smaller than a thickness of the electrolytic filling plating material deposited on the inside wall of the hole and on the metal foil.

2. The method for manufacturing a multilayer wiring board according to claim 1, wherein an aspect ratio of a depth of the hole to an opening size of the hole after performing the electrolytic filling plating is equal to or greater than an aspect ratio of a depth of the hole to an opening size of the hole before performing the electrolytic filling plating.

3. The method for manufacturing a multilayer wiring board according to claim 1,
   wherein temporarily decreasing the electric current density occurs before a plating void is formed.

4. The method for manufacturing a multilayer wiring board according to claim 1, wherein the temporary decrease of electric current density is 50% or more.

5. The method for manufacturing a multilayer wiring board according to claim 1, wherein after increasing the electric current density, the electric current density is equal to or larger than the electric current density before temporarily decreasing the electric current density.

6. The method for manufacturing a multilayer wiring board according to claim 1, wherein the hole is formed by a conformal method or a direct laser method.

7. The method for manufacturing a multilayer wiring board according to claim 1, wherein a streak appears between a layer of the electrolytic filling plating material formed before temporarily decreasing the electric current density and a layer of the electrolytic filling plating material formed after temporarily decreasing the electric current density.

* * * * *